United States Patent
Tsuji

(10) Patent No.: US 6,384,632 B2
(45) Date of Patent: May 7, 2002

(54) BUFFER CIRCUIT

(75) Inventor: Nobuaki Tsuji, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/790,050

(22) Filed: Feb. 21, 2001

(30) Foreign Application Priority Data

Feb. 22, 2000 (JP) ........................................ 2000-044863

(51) Int. Cl.[7] .......................................... H03K 19/0185
(52) U.S. Cl. ............................ 326/81; 326/83; 326/58
(58) Field of Search ............................. 326/56, 57, 58, 326/80, 81, 83, 86; 327/534, 537

(56) References Cited

U.S. PATENT DOCUMENTS

| | | | |
|---|---|---|---|
| 5,748,011 A | * | 5/1998 | Takahashi et al. ............ 326/83 |
| 5,831,449 A | * | 11/1998 | Shigehara et al. ............ 326/81 |
| 6,043,681 A | * | 3/2000 | Lim ............................. 326/81 |
| 6,236,235 B1 | * | 5/2001 | Arai et al. ..................... 326/81 |

* cited by examiner

*Primary Examiner*—Michael Tokar
*Assistant Examiner*—Daniel D. Chang
(74) *Attorney, Agent, or Firm*—Pillsbury Winthrop LLP

(57) ABSTRACT

A buffer circuit comprises a data input terminal; an enabling terminal inputting an enabling signal; an output terminal; a first power source terminal supplying high potential voltage; a second power source terminal supplying low potential voltage; a first N-channel transistor connected between said output terminal and said second power source terminal; a common bulk P-channel transistors group of a first to fifth transistors formed on a common bulk region; a second N-channel transistor formed between said one node and said second power source terminal and comprising a gate electrode supplied an inverted signal of an enabling signal; and a logic circuit either inputting an inverted signal of said input signal to said gate electrodes of said first P-channel transistor and said first N-channel transistor, or inputting a signal keeping said first P-channel transistor turned off to the gate electrode of said first P-channel according to state of said enabling signal.

14 Claims, 5 Drawing Sheets

*PRIOR ART*

BUFFER CIRCUIT

This application is based on Japanese Patent Application 2000-044863, filed on Feb. 22, 2000, the entire contents of which are incorporated herein by reference.

BACKGROUND OF THE INVENTION

A) Field of the Invention

This invention relates to a buffer circuit having an output terminal through which data can be transferred to and from an external device.

B) Description of the Related Art

In the art of a semiconductor integrated circuit, it is important to raise the accumulation of the circuit while reducing the power consumption. It is effective for reducing the power consumption of an integrated circuit to lower the voltage of a power supply. In a transition period from a conventional 5V power supply to a new 3.3V power supply, for example, a multi-voltage circuit is used, wherein some parts of the circuit are designed to be driven by the 5V power supply while others to be driven by the 3.3V power supply. When a signal is output from a 5V part to a 3.3V part in that kind of multi-voltage circuit, some problems may occur. When a higher voltage than the voltage of a power source is applied to an input terminal, a Silicon Controlled Rectifier (SCR) of p-n-p-n structure with PMOS and NMOS is turned on, resulting in a formation of a current leak path or a latch up. In some case, a large amount of electric current flows through the SCR, resulting in over heating of the semiconductor integrated circuits.

Japanese Patent Publication H07-79232 discloses a driver circuit shown in FIG. 5 that solves those problems. Power source voltage VDD of this driver circuit is 3.3V, and when a high level (H-level) enabling signal EN is supplied to an enabling terminal 10, data D supplied to a data input terminal 28 could be output from a data output terminal 24. On the other hand, when an L-level (0V) enabling signal EN is supplied to an enabling terminal 10, output impedance of the data output terminal 24 will be a state of high impedance. Therefore, a 5V signal can be supplied to a bus connected to the output terminal 24. Moreover, this driver circuit is built in a P-type silicon substrate whereas N-channel transistors are formed on an N-well formed on the P-type silicon substrate. Especially N-channel transistors 30, 32, 36 and 38 are formed on the same N-well that is floating.

First, a case when an enabling signal is high level will be considered. In this case, an N-channel transistor 12 is turned on and so an N-channel transistor 34 is also turned on; therefore, gate voltage of a P-chancel transistor 32 will be at the L-level. The P-chancel transistor 32 will be turned on. Because gate voltage of an N-channel transistor 26 is maintained to be at the power source voltage VDD, the transistor 26 is also turned on. On the other hand, gate voltages of both of a P-channel transistor 30 and N-channel transistor 22 are inversion of the data D. Therefore, when the data D is at the high level, voltage of the data output terminal 24 will be at the high level, and when the data D is at the L-level, voltage of the data output terminal 24 would be at the L-level.

Next, a case when an enabling signal is at the L-level will be considered. In this case, an N-channel transistor 12 is turned off. The gate voltage of the N-channel transistor 22 will be at the L-level, and the N-channel transistor 22 will be turned off. Moreover, the gate voltage of the P-channel transistor 30 will be at the high level, and the P-channel transistor 30 will be turned off. Therefore, output impedance of the data output terminal 24 would be in a state of high impedance.

At that time, assumingly a switch 44 is turned on, and an output signal S with 0V L-level and 5V high level is supplied from an external device 42 driven at 5V to the driver circuit. If the threshold voltage of the P-channel transistor 30 is 0.7V and voltage of the signal S is 5V, the P-channel transistor 30 would be turned on. Then, voltage of a node B becomes 5V whereas the gate voltage of the P-channel transistor 36 is 0V; therefore, the transistor 36 will be turned on. Also, the P-channel transistor 32 will be turned off. By that, current flow to the side of a voltage source 28 (VDD) can be prevented.

Also, N-wells of the P-channel transistors 30, 32 and 36 are auto-biased by parasitic diodes formed between their drains and the N-wells. Therefore, current feedback by the parasitic pnp transistors including N-wells and the P-type silicon substrate will be vanished.

By forming a P-channel transistor 38, when the voltage of the data output terminal 24 is at the L-level, an N-well is always biased by the power supply voltage VDD. The formation of the P-channel transistor 38 minimizes the possibility that the parasitic pnp transistors turn on during the transition of the signal S from the L-level to the high level.

As said in the above, in the driver circuit shown in FIG. 4, because there are no paths for the current flow to the semiconductor substrate, the problem of latch up can be solved.

By the way, in the above-described driver circuit, chip sizes of the P-channel transistors 32 and 30 and the N-channel transistors 22 and 26 will be large if large output current needed when the data D is output from the data output terminal 24 because gate widths of the transistors have to be increased to derive large current from the transistors.

In a practical circuit, a plurality of transistors need to be connected in parallel to form each of the P-channel transistors 32 and 30 and the N-channel transistors 22 and 26.

However, there are problems in the enlargement of the chip sizes because the large chip sizes increase cost of manufacturing and also decrease the productivity due to the large number of the elements needed for manufacturing.

SUMMARY OF THE INVENTION

It is an object of the present invention to provide a driver circuit that is small in chip size while eliminating paths for the current flowing to a semiconductor substrate.

According to one aspect of the present invention, there is provided a buffer circuit comprising: a data input terminal to which a data signal is input; an enabling terminal to which an enabling signal is input; an output terminal from which output data are output; a first power source terminal to which high potential voltage is supplied; a second power source terminal to which low potential voltage lower than said high potential voltage is supplied; a first N-channel transistor that is connected between said output terminal and said second power source terminal; a common bulk P-channel transistors group that comprises a first, a second, a third, a fourth and a fifth transistors formed on a common bulk region, wherein the first P-channel transistor that is connected between said first power source terminal and said output terminal, the second P-channel transistor that is formed between said output terminal and one node and comprises a gate electrode connected to said first power source terminal, the third P-channel transistor that comprises a first current terminal connected to said output terminal, a second current terminal connected to a gate electrode of said first P-channel transistor, and a gate electrode connected to said first power source terminal, the fourth P-channel transistor that is formed between said first power source terminal and said gate electrode of said first P-channel transistor and comprises a gate electrode of which is supplied an inverted signal of the enabling signal, and the fifth P-channel transistor that comprises a drain electrode connected to said bulk region, a source electrode connected to said first power source terminal and a gate electrode connected to said one node; a second N-channel transistor that is formed between said one node and said second power source terminal and comprises a gate electrode supplied an inverted signal of an enabling signal; and a logic circuit that inputs an inverted signal of said input signal to said gate electrodes of said first P-channel transistor and said first N-channel transistor when status of said enabling signal is in one state, or inputs a signal keeping said first P-channel transistor turned off to the gate electrode of said first P-channel transistor when the status of said enabling signal is in another state.

In this buffer circuit, when said enabling signal is in one state, a signal based on the input data signal input from the data input terminal will be output from said output terminal.

On the other hand, when said enabling signal is in another state, said P-channel transistor will be kept turned off, and so said output terminal will be a state of high impedance.

As said in the above, according to this invention, in a buffer circuit wherein an output terminal can be controlled to be a state of high impedance, the number of transistors for output can be reduced while preventing current leak and latch up when voltage induced to the output terminal is higher than that of power supply.

DETAILED DESCRIPTION OF THE PREFERRED EMBODIMENTS

A first embodiment of this invention will be explained below with reference to FIGS. 1 to 3.

Figure 1:
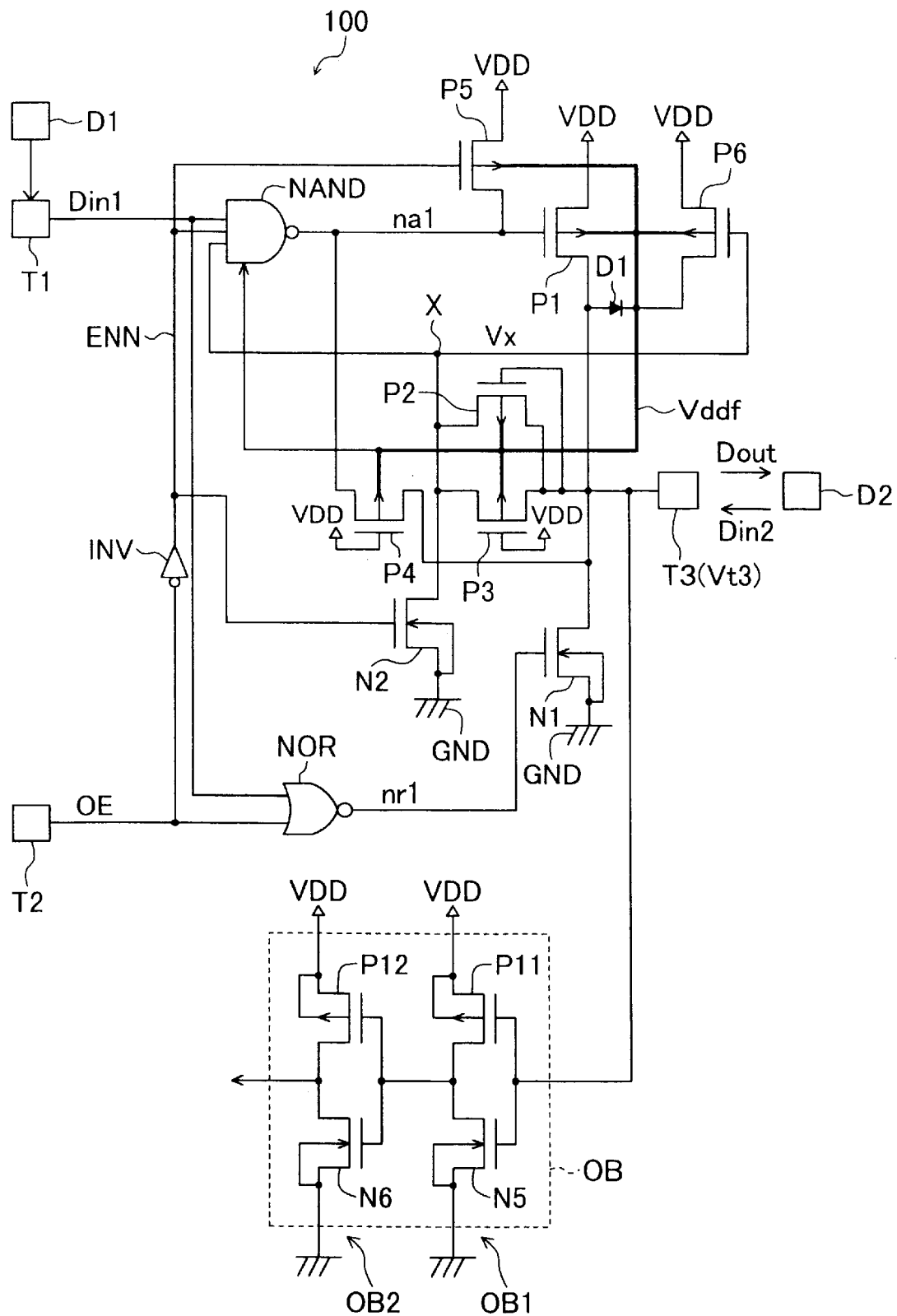
FIG. 1 is a circuit diagram showing a structure of a buffer circuit according to a first embodiment of the invention.

FIG. 1 is a circuit diagram showing a structure of a buffer circuit according to the first embodiment. FIG. 2 is a cross sectional view showing an essential part of the buffer circuit. The buffer circuit 100 has P-channel transistors P1 to P6, P11 and P12, N-channel transistors N1, N2, N5 and N6, a nand circuit NAND, a nor circuit NOR, an inverter circuit INV1, input terminal T1, an enabling terminal T2, and input/output (IO) terminal T3. A parasitic diode D1 is formed between a drain electrode of the P-channel transistor P1 and a bulk.

The buffer circuit 100 also has a first and second power source terminal. Through the first power source terminal VDD is supplied lower power source voltage VDD on the high potential side. Through the second power source terminal GND is supplied power source voltage GND on the low potential side. The voltage VDD, for example, is 3.3V. An enabling signal OE activated at the L-level (Low level) is supplied to the enabling terminal T2, and a first input data Din1 is supplied to the input terminal T1. Logic level voltage of the enabling signal OE and the first input data Din1 at the L-level is the GND while that at the H-level (High level) is the VDD.

Also, output data Dout is output from the IO terminal T3 when the enabling signal OE is at the L-level. Logical level voltage of the output data Dout at the L-level is GND while that at the high level is VDD. On the other hand, when the enabling signal OE is at the high level, output impedance of the IO terminal T3 will be a state of high impedance. At the same time, a second input data Din2 is supplied from an external circuit D2. Logical level voltage of the second input data Din2 at the L-level is GND while that at the high level is VDD' (higher power source voltage). The voltage VDD', for example, is 5V. That is, this buffer circuit 100 has two modes: an output mode wherein the output data Dout is output from the IO terminal T3 by buffering the first input data Din1; an input mode wherein the second input data Din2 is taken in through the IO terminal T3.

The P-channel transistor P1 and the N-channel transistor N1 are output transistors for amplifying current, and so their occupying areas are wide because each of them is formed with a parallel connection of a plurality of transistors on an integrated circuit.

Figure 2:
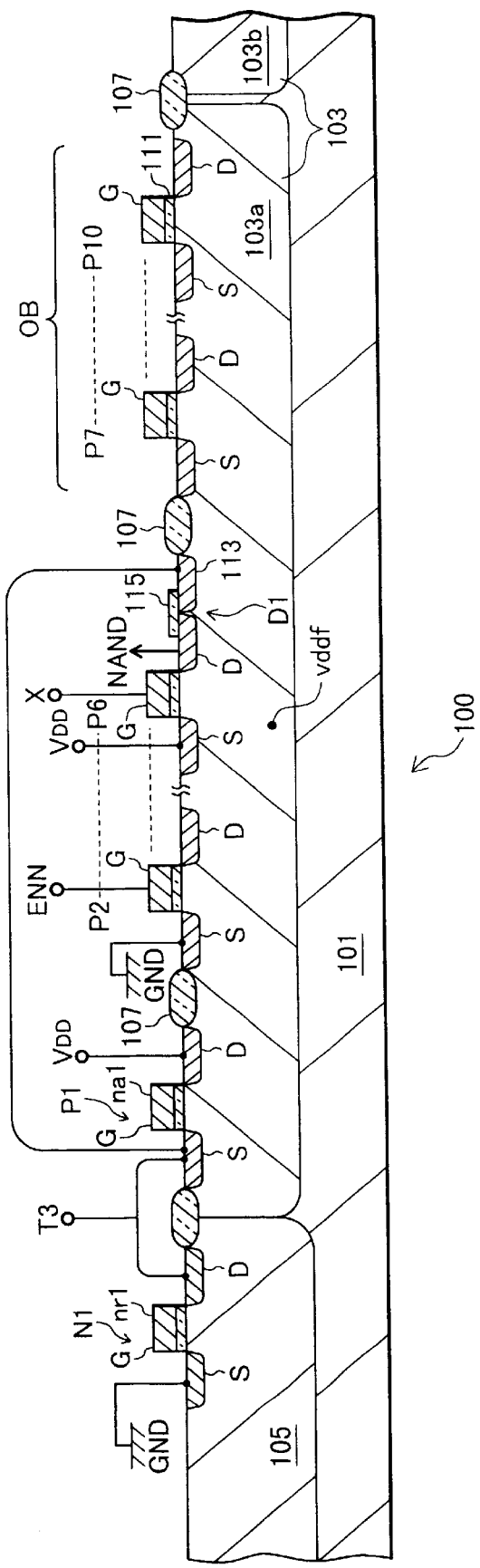
FIG. 2 is a cross sectional view showing a part of the buffer circuit according to the first embodiment.

As shown in FIG. 2, the P-channel transistors P1 to P6 and the P-channel transistors P7 to P10 forming the later described nand circuit NAND has a common bulk region 103a. In this embodiment, a silicon substrate 101 is a P-type substrate, and the bulk region 103a shown as solid lines in FIG. 1 is an N-well formed on the P-type silicon substrate 101. Provided that a N-type substrate is used for the silicon substrate 101, the bulk region 103a will be the N-type silicon substrate. Further, the common bulk region 103a has no terminals for supplying power supply voltage VDD or earth voltage GND, so that the common bulk region 103a is floating. Voltage of the common bulk region 103a will be hereinafter called Vddf.

In detail, a P-well 103 and an N-well 105 are formed on an N-type silicon substrate 101. The P-well 103 and the N-well 105 are, for example, separated by a silicon oxide layer formed by the local oxidation of silicon (LOCOS) method.

The P-well 103 has many regions separated by the silicon oxide layer 107. In FIG. 2, a first P-well region and a second P-well region 103b are illustrated, and the first P-well region hereinafter called a common bulk region 103a.

In the common bulk region 103a are formed a first P-channel transistor P1 and a second to sixth P-channel transistors P2 to P6.

In addition, on the common bulk region 103a, a seventh to a tenth P-channel transistors P7 to P10 that are included in the later-described output buffer circuit OB are formed.

Each transistor is formed of silicon oxide and has a gate electrode G formed across a gate insulating film 111, a source electrode S and a drain electrode D.

A high dense n-type region 113 is formed in contact with the drain electrode D of the sixth P-channel transistor P6. A common electrode 115 is formed on the drain electrode D and the high dense n-type region 113.

A first N-channel transistor N1 is included in the N-well 105. A drain electrode D of the first N-channel transistor N1 and the first P-channel transistor P1 are connected to form an IO terminal T3. The common bulk region may consist of a plurality of regions connected with each another.

The P-channel transistors P2 and P3 are formed between a node X and the IO terminal T3 and work as a switch. Especially, the P-channel transistor P3 is turned on and supplies voltage Vt3 to the node X when the voltage Vt3 of the IO terminal T3 is higher than that of the power supply voltage in said input mode, i.e., when the second input data Din2 is at the high level. The transistor P2 may be omitted.

The P-channel transistor P5 is turned on in the output mode and can turn off the gate electrode of the P-channel transistor P1 by impressing power source voltage VDD. Moreover, the P-channel transistor P4 is turned on and supplies VDD when the voltage Vt3 is higher than the power supply voltage VDD.

The P-channel transistor P6 is turned on in the output mode and supplies power source voltage VDD to the common bulk region 103a. On the other hand, in the input mode, the P-channel transistor P6 is turned off and does not supply power source voltage VDD to the common bulk region 103a. Moreover, the N-channel transistor N2 is turned on in the out put mode and biases a node X at 0V.

Figure 3:
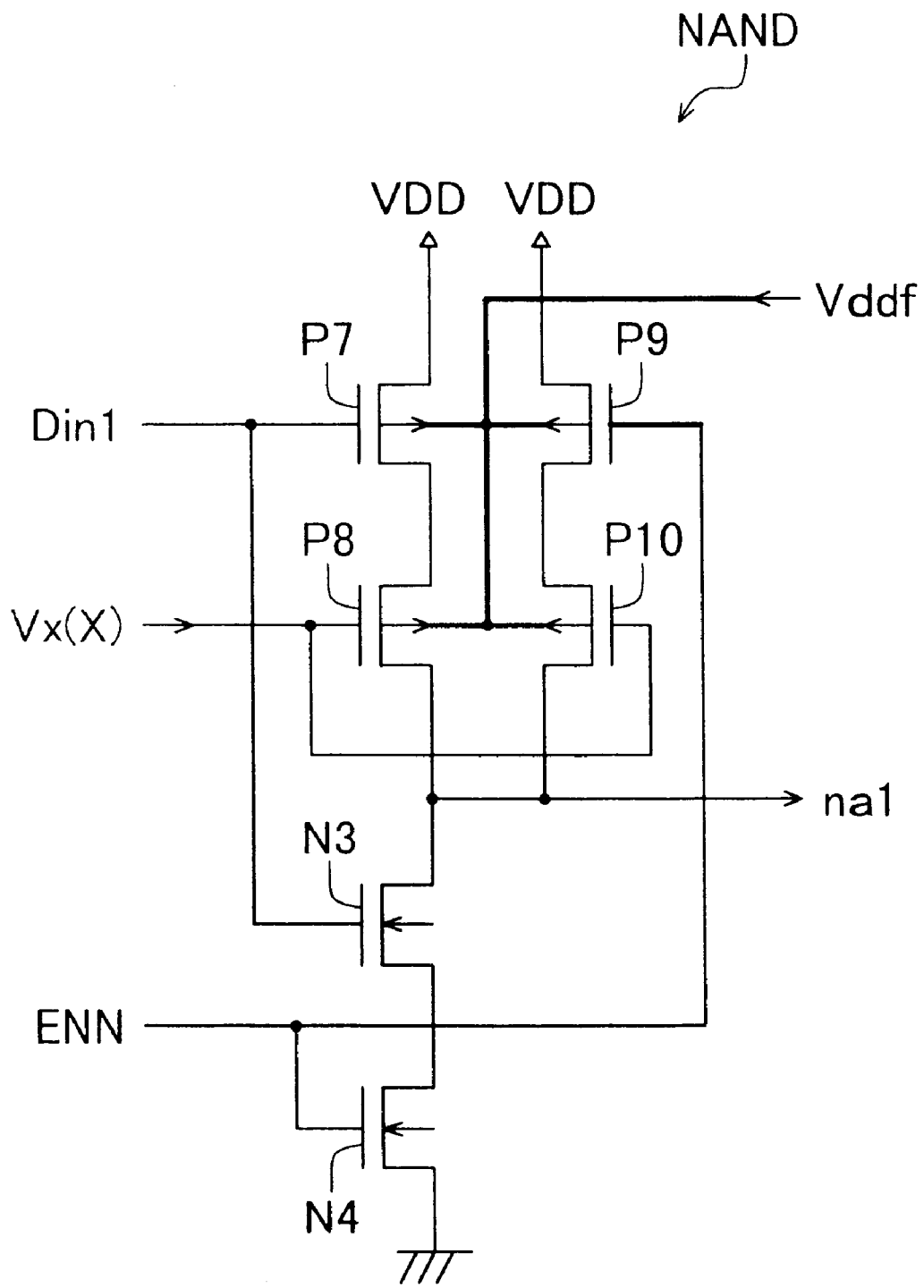
FIG. 3 is a circuit diagram showing a structure of a NAND circuit according to the first embodiment.

FIG. 3 shows a structure of the nand circuit NAND. As shown in this drawing, the nand circuit NAND has P-channel transistors P7 to P10 and N-channel transistors N3 and N4. In this nand circuit NAND the common bulk region 103a is used as a bulk for the P-channel transistors P7 to P10. Also, the nand circuit is characterized by having the P-channel transistors P8 and P10.

Each gate electrode of the P-channel transistors P8 and P10 is supplied voltage Vx of the node X. Those transistors P8 and P10 are turned off when the voltage Vx is at the high level.

Transistors at an output stage are formed only with the P-channel transistor P1 and the N-channel transistor N1. Supplying large current from the input terminal T3 in the output mode can be realized only by enlarging sizes of the P-channel transistor P1 and the N-channel transistor N1; therefore, whole chip area of the buffer circuit 100 can be reduced.

Moreover, the common bulk region 103a of the P-channel transistors P2 to P10 is floating. If the voltage Vt3 at the input-output terminal becomes larger than the power source voltage VDD in the input mode, only the common bulk region 103a would be biased via the parasitic diode D1. Therefore, there will be no chance to latch up by flowing large current.

As shown in FIG. 1, the buffer circuit 100 has the output buffer circuit OB connected to the 10 terminal T3. The output buffer circuit OB has a first CMOS inverter OB1 consisting of an eleventh P-channel transistor P11 and a fifth N-channel transistor N5. Also, the output buffer circuit OB has a second CMOS inverter OB2 consisting of an twelfth P-channel transistor P12 and a sixth N-channel transistor N6. The output buffer circuit OB amplifies an output signal.

Next, operation of the buffer circuit 100 according to the first embodiment will be described by classifying the operation into two modes: the input mode and the output mode.

In the input mode, the enabling signal OE will be H-level. The P-channel transistors P1 to P6 make up a p-n junction diode between VDD and Vddf. Therefore, the value of Vddf is lower than that of the VDD by forward on-voltage Vf of the diode.

By the way, because the enabling signal OE is H-level, an output signal na1 of the nand circuit NAND will be H-level, and the voltage of the output signal na1 should be the same as the power source voltage VDD. However, the voltage of the output signal na1 is supplied from the power source voltage VDD via the P-channel transistors P7 and P8 or P9 and P10. Therefore, the nand circuit NAND cannot make the gate voltage of the P-channel transistor P1 agree with the power source voltage VDD only by itself. In order to solve this problem, the P-channel transistor P5 is formed. That is, because an inverted enabling signal ENN is supplied to a gate electrode of the P-channel transistor P5, it will be turned on in the input mode. Therefore, it will be possible to make the voltage of the output signal na1 agree with the power source voltage VDD, and that makes the P-channel transistor P1 certainly turned off. By that, the buffer circuit 100 will operate correctly without unnecessary current leak.

Next, a case wherein the Vt3 is larger than VDD will be considered. For example, it is a case wherein voltage of the second input data Din2 is 5V. In that case, the voltage of the signal na1 is 0V, and so the N-channel transistor N1 will be turned off.

Moreover, since the Vt3 is larger than VDD, the P-channel transistor P2 will be turned off. On the other hand, the P-channel transistor P3 will be turned on. Therefore, the voltage Vx at the node X will agree with the Vt3, and the P-channel transistor P6 will be turned off.

By the way, the parasitic diode D1 is attached between the drain electrode of the P-channel transistor P1 and the common bulk region 103a. When the voltage Vt3 at the IO terminal T3 is larger than the power source voltage VDD, that the parasitic diode D1 will be turned on. Providing that forward descending voltage of the parasitic diode D1 is Vf, the voltage Vddf of the common bulk region 103a can be expressed by a equation: Vddf=Vt3−Vf.

Next, because the voltage of the inverted enabling signal ENN is 0V, N-channel transistor N2 will be turned off. Also, since the Vt3 is larger than VDD, the P-channel transistor P3 will be turned on, and the voltage Vt3 will be supplied to the Node X.

In addition to that, since the voltage Vx at the node X will agree with the Vt3 and Vddf=Vt3−Vf, the P-channel transistors P8 and P10 forming the nand circuit NAND will be turned off. Also, because the voltage of the inverted enabling signal ENN is 0V, the N-channel transistor N4 will be turned off.

Also, since the P-channel transistor P4 is turned on, ENN=0, na1=Vt3 and Vddf=Vt3−Vf, so the drain voltage of the P-channel transistor P5 will be Vt3. On the other hand, source voltage of the P-channel transistor P5 is VDD, and so that transistor P5 will be turned on, and some electricity will be flown through the transistor P5. Meanwhile, the gate voltage of the P-channel transistor P1 will be Vt3. Since the voltage Vt3 is higher than the voltage Vddf at the common bulk region 103a, the P-channel transistor P1 will be turned off.

Therefore, in that case, there is no path for the current leak except the P-channel transistor P5. When Vt3 is higher than VDD, Vx equals to Vt3. The P-channel transistor P2 reduces Vx to 0V when Vt3 comes to 0V. Further, the P-channel transistor P3 itself can perform the same thing as the P-channel transistor P2 does; therefore, the P-channel transistor P2 may be omitted.

Next, the operation of the buffer circuit 100 in the output mode will be explained. In the output mode, the enabling signal OE is at the L-level.

The voltage of the inverted enabling signal will be VDD, and so the N-channel transistor N2 is turned on, and the voltage Vx at the node X will be 0V. In the output mode, the voltage Vt3 at the 10 terminal T3 will never be higher than the power source voltage VDD; therefore, the P-channel transistors P2 and P3 are turned off.

On the other hand, the gate electrode of the P-channel transistor P6 is supplied the voltage Vx (=0V), so it will be tuned on. Therefore, the power source voltage VDD is supplied to the common bulk region 103a, and its voltage Vddf will agree with VDD. Also, bulk voltage of the P-channel transistors P7 to P10 that form the nand circuit NAND will be VDD, and so the nand circuit NAND will operate as a general inverted "AND" circuit. More specifically, the P-channel transistors P7 and P8 are always kept turned on since Vx=0V, and the P-channel transistor P9 is turned off since ENN=VDD. On the other hand the N-channel transistor N4 is turned on. By that, the nand circuit NAND will be similar to an inverter circuit that series-connects the P-channel transistor P7 and the N-channel transistor N3. Therefore, the output signal na1 of the nand circuit NAND will be inversion of the first input data Din1.

Moreover, because the gate voltage of the P-channel transistor P5 will be VDD, the P-channel transistor P5 will be turned off. In addition, the P-channel transistor P4 will be turned off.

Therefore, the buffer circuit 100 in the output mode will be similar to a circuit that consists of a series connection of a first inverted circuit (corresponding to the nand circuit NAND and the nor circuit NOR) and a second inverted circuit consisting of the P-channel transistor P1 and the N-channel transistor N1. The buffer circuit 100 can output, from the IC terminal T3, an output data Dout that has the same polarity as the first input data Din1 and is amplified. Also, in the output mode, there is no path for unnecessary current leak.

In the input mode, although a little current leak flows into the P-channel transistor P5 when Vt3 is higher than VDD, the P-channel transistor P5 is positively turned on only when 0V<Vt3<VDD. The object is to turn off the P-channel transistor P1 by biasing VDD to the gate electrode of the P-channel transistor P1. Therefore, the size of the P-channel transistor P5 may be small.

Figure 5:
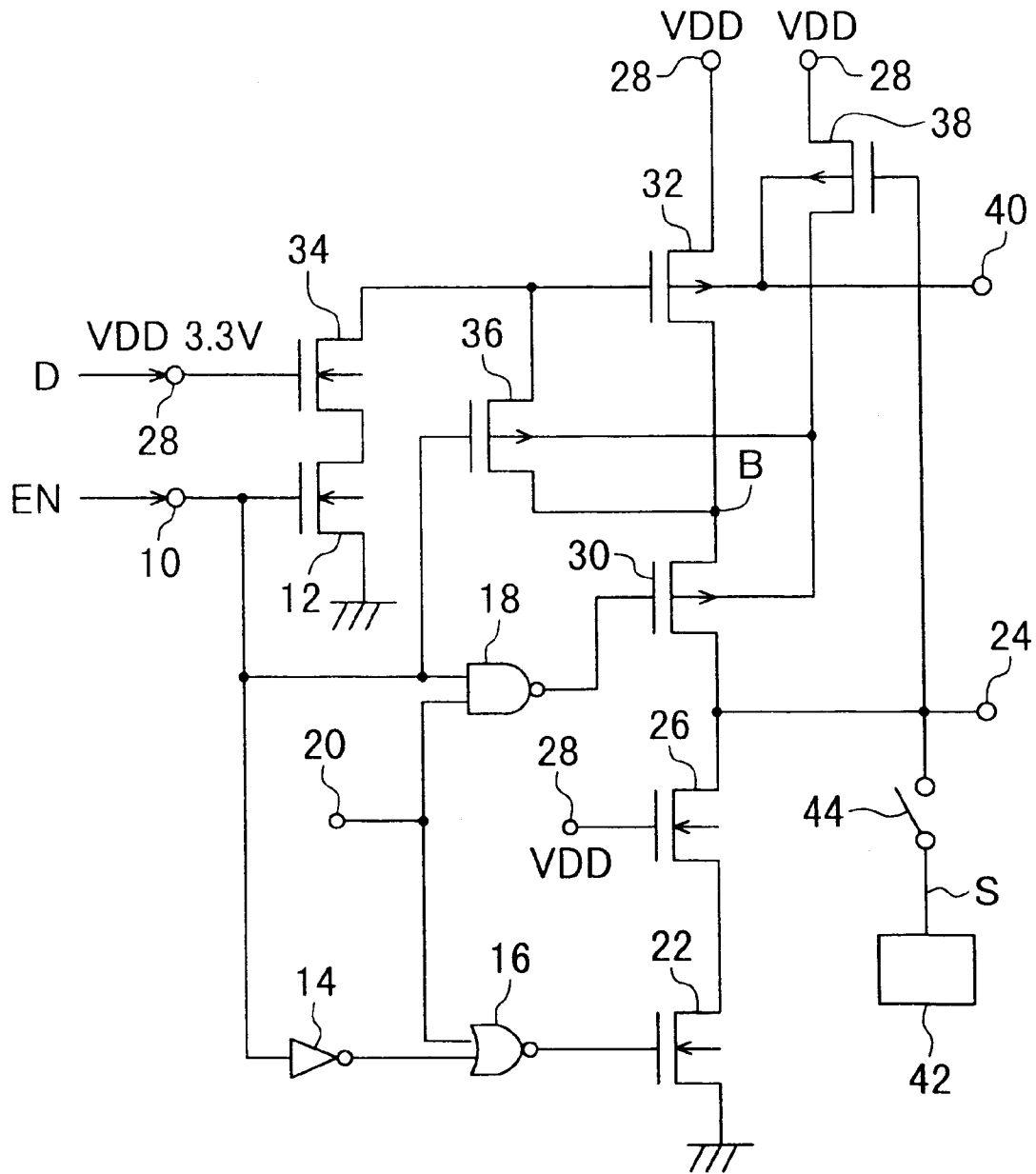
FIG. 5 is a circuit diagram showing a structure of a buffer circuit according to a prior art.

As said in the above, in the buffer circuit according to the first embodiment, there is no risk for problems such as latch up or the like because no unnecessary current flows although there would be a little current leak into the P-channel transistor P5 when Vt3 is high than VDD in the input mode. Moreover, comparing to the conventional buffer circuit shown FIG. 5, a chip area occupied by the buffer circuit 100 can be drastically reduced because the number of P-channel transistors and the N-channel transistors at the output step can be reduced.

Next, a second embodiment will be described. In the above-described buffer circuit 100 according to the first embodiment, a little current leak flows into the P-channel transistor P5 when Vt3 is higher than VDD in the input mode. In a buffer circuit 200 according to the second embodiment, consuming electric current can be reduced more than the first embodiment.

Figure 4:
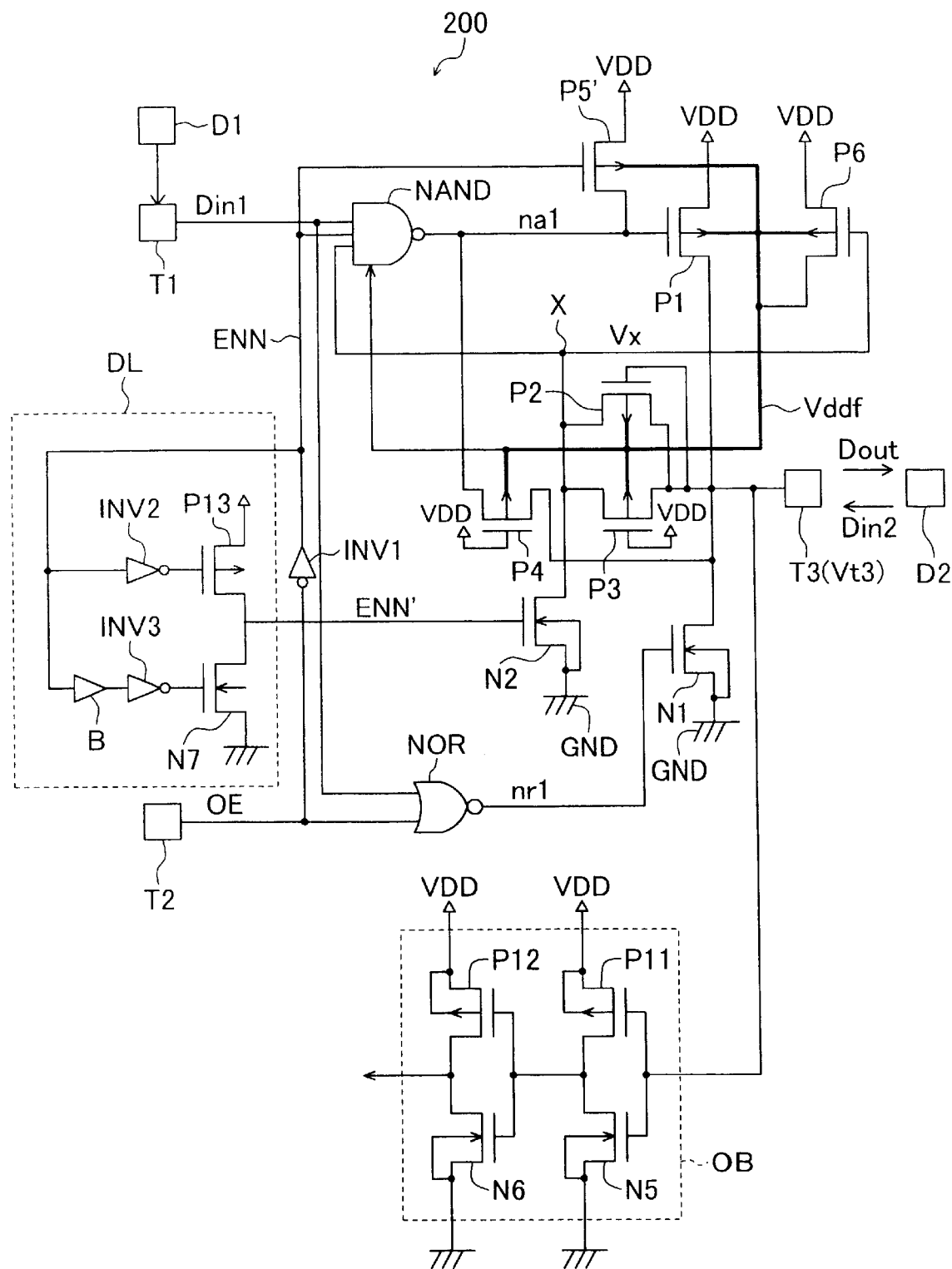
FIG. 4 is a circuit diagram showing a structure of a buffer circuit according to a second embodiment of the invention.

FIG. 4 shows a structure of the buffer circuit 200 according to the second embodiment. As shown in FIG. 4, the buffer circuit 200 has a P-channel transistor P5' of which gate length is longer than that of the P-channel transistor P5 of the buffer circuit 100. Also, the buffer circuit 200 has a delay circuit DL that delays an inverted enabling signal ENN and is configured between an inverter INV1 and a gate electrode of a N-channel transistor N2. Other components are similar to those of the buffer circuit 100 according to the first embodiment.

The gate of the P-channel transistor P5' is long; therefore, on-resistance is higher than that of the P-channel transistor P5 (FIG. 1). By that, in the output mode, when the voltage (Vt3—VDD) is impressed between a source electrode and a drain electrode of the transistor P5', electric current value flowing there is smaller than those of the transistor P5 (FIG. 1). In a general integrated circuit, transistors are made up with the same unit; however, in this embodiment, the P-channel transistor P5' is made with other unit. For example, when a gate length of other P-channel transistors P2 to P12 is 10 micrometers, the gate length of the P-channel transistor P5' will be set at 100 micrometers. By doing so, when Vt3 is higher than VDD in the input mode, it is possible to reduce electric current value flowing through the P-channel transistor P5' to about one tenth.

By the way, the gate electrode of the P-channel transistor P1 holds stray capacitance because of wiring pattern or the like. By the stray capacitance, if the on-resistance of the P-channel transistor P5' is increased, time constant will increase. Providing that the signal na1 is 0V in the output mode and the mode is changed to the input mode, the gate voltage of the P-channel transistor P1 gradually increases from 0V to 3V by the large time constant. Therefore, there may be a risk for the P-channel transistor P1 not to be turned off quickly. In this embodiment, the delay circuit DL is configured to supply the voltage VDD to the gate electrode of the P-channel transistor P1 just after the change of the modes.

The delay circuit DL, as shown in FIG. 4, has a buffer B, inverters INV2, INV3, a P-channel transistor P13 and an N-channel transistor N7. According to this delay circuit, because of transfer delay of each component, the inverted enabling signal ENN will be delayed and output as a delayed inverted enabling signal ENN'.

The N-channel transistor N2 will be turned off slightly after the inverted enabling signal ENN is changed from H-level to L-level (i.e., when the mode is changed from the output mode to the input mode). As a result of that, the N-channel transistor N2 has been turned on, and the voltage Vx at the Node X is kept at 0V; therefore, the P-channel transistors P8 and P10 shown in FIG. 2 will be turned on. Meanwhile, the gate voltage of the P-channel transistor P9 has already been at the L-level, so the voltage of the output signal na1 of the nand circuit NAND agrees with the power source voltage VDD.

Then, after a predetermined period (e.g., 15ns) elapsed, the N-channel transistor N2 will be turned off. By that, the P-channel transistor P5 will be turned on as similar to the first embodiment, and the gate electrode of the P-channel transistor P1 will be biased at Vt3.

As said in the above, in the buffer circuit 200 according to the second embodiment, leak current can be reduced by increasing on-resistance by making the length of the gate of the P-channel transistor P5' long, and the P-channel transistor P1 can be turned off certainly in the input mode by using the delay circuit DL.

In this specification, a first P-channel transistor in claim corresponds to the first P-channel transistor P1 in the embodiments. A second P-channel transistor in claim corresponds to the third P-channel transistor P3 in the embodiments. A third P-channel transistor in claim corresponds to the fourth P-channel transistor P4 in the embodiments. A fourth P-channel transistor in claim corresponds to the fifth P-channel transistor P5 in the embodiments. A fifth P-channel transistor in claim corresponds to the sixth P-channel transistor P6 in the embodiments. A sixth P-channel transistor in claim corresponds to the second P-channel transistor P2 in the embodiments.

The present invention has been described in connection with the preferred embodiments. The invention is not limited only to the above embodiments. It will be apparent to those skilled in the art that various modifications, improvements, combinations and the like can be made.

What are claimed are:

1. A buffer circuit comprising:
a data input terminal to which a data signal is input;
an enabling terminal to which an enabling signal is input;
an output terminal from which output data are output;
a first power source terminal to which high potential voltage is supplied;
a second power source terminal to which low potential voltage lower than said high potential voltage is supplied;
a first N-channel transistor that is connected between said output terminal and said second power source terminal;
a common bulk P-channel transistors group that comprises a first, a second, a third, a fourth and a fifth transistors formed on a common bulk region, wherein
the first P-channel transistor that is connected between said first power source terminal and said output terminal,
the second P-channel transistor that is formed between said output terminal and one node and comprises a gate electrode connected to said first power source terminal,
the third P-channel transistor that comprises a first current terminal connected to said output terminal, a second current terminal connected to a gate electrode of said first P-channel transistor, and a gate electrode connected to said first power source terminal,
the fourth P-channel transistor that is formed between said first power source terminal and said gate electrode of said first P-channel transistor and comprises a gate electrode of which is supplied an inverted signal of the enabling signal, and
the fifth P-channel transistor that comprises a drain electrode connected to said bulk region, a source electrode connected to said first power source terminal and a gate electrode connected to said one node;
a second N-channel transistor that is formed between said one node and said second power source terminal and comprises a gate electrode supplied an inverted signal of an enabling signal; and
a logic circuit that inputs an inverted signal of said input signal to said gate electrodes of said first P-channel transistor and said first N-channel transistor when status of said enabling signal is in one state, or inputs a signal keeping said first P-channel transistor turned off to the gate electrode of said first P-channel transistor when the status of said enabling signal is in another state.

2. A buffer circuit according to claim 1, wherein said data input terminal is input a first data signal, and
said output terminal not only outputs but is input a second data signal being different from said first data signal.

3. A buffer circuit according to claim 1, further comprising a sixth P-channel transistor that is formed on said common bulk region, configured between said output terminal and said one node, and comprises a gate electrode connected to said output terminal.

4. A buffer circuit according to claim 1, further comprising an output buffer circuit that is connected to said output terminal and amplifies an output signal.

5. A buffer circuit according to claim 1, wherein said first to fifth P-channel transistors are formed on a semiconductor substrate, and said common bulk region is formed of one conductive region formed on said semiconductor substrate.

6. A buffer circuit according to claim 1, wherein said logic circuit comprises a first and second circuits, wherein
the first circuit impresses a signal based on said input signal to the gate electrode of said first N-channel transistor when the status of the enabling signal is in one state, or impresses said high potential voltage to the gate electrode of said first N-channel transistor when the status of the enabling signal is in another state, and
the second circuit is a group of a seventh, an eighth, a ninth and a tenth common bulk P-channel transistors formed on said common bulk region, comprising
a series connection of the seventh and the eighth P-channel transistors formed between said first power source terminal and a node of the gate electrode of said first P-channel transistor and said second current terminal of said third P-channel transistor,
a series connection of the ninth and the tenth P-channel transistors formed between said first power source and said node, and
a series connection of a third and a fourth N-channel transistors formed between said node and said second current terminal, wherein
each gate electrode of said seventh P-channel transistor and said third N-channel transistor is connected to said input terminal,
each gate electrode of said ninth P-channel transistor and said fourth N-channel transistor is connected to said enabling terminal, and
each gate electrode of said eighth P-channel transistor and said tenth P-channel transistor is connected to said one node.

7. A buffer circuit according to claim 6, wherein said first circuit is a two-input NOR circuit.

8. A buffer circuit according to claim 6, wherein said second circuit is a multi-input NAND circuit.

9. A buffer circuit according to claim 1, wherein an on-resistance of said fourth P-channel transistor is set to be higher than those of other transistors.

10. A buffer circuit according to claim 9, further comprising a delay circuit that is formed between said enabling terminal and a gate electrode of said second N-channel transistor, delays an enabling signal and output the enabling signal.

11. A buffer circuit according to claim 10, wherein said delay circuit has delay time similar to time constant determined by on-resistance of said fourth P-channel resistor and parasitic capacitance accompanying to the gate electrode of said first P-channel transistor.

12. A buffer circuit according to claim 1, wherein a gate length of said fourth P-channel transistor is set to be longer than those of other transistors.

13. A buffer circuit according to claim 12, further comprising a delay circuit that is formed between said enabling terminal and a gate electrode of said second N-channel transistor, delays an enabling signal and output the enabling signal.

14. A buffer circuit according to claim 13, wherein said delay circuit has delay time similar to time constant determined by on-resistance of said fourth P-channel resistor and parasitic capacitance accompanying to the gate electrode of said first P-channel transistor.

* * * * *